United States Patent [19]
Haj-Ali-Ahmadi et al.

[11] Patent Number: 5,140,879
[45] Date of Patent: Aug. 25, 1992

[54] VARIABLE ARRAY PUNCH

[75] Inventors: Javad Haj-Ali-Ahmadi, Austin; Jerome A. Frankeny, Taylor; Karl Hermann, Austin, all of Tex.

[73] Assignee: International Business Machines Corporation, Armonk, N.Y.

[21] Appl. No.: 626,659

[22] Filed: Dec. 12, 1990

[51] Int. Cl.$^5$ .............................................. B26F 1/04
[52] U.S. Cl. ........................................ 83/39; 83/50; 83/52; 83/571; 83/622; 234/1; 234/49
[58] Field of Search .............. 83/39, 49, 50, 52, 425.1, 83/426, 427, 555, 571, 622; 234/1, 49, 50

[56] References Cited

U.S. PATENT DOCUMENTS

| | | | |
|---|---|---|---|
| 3,073,196 | 1/1963 | Marcalus | 83/659 X |
| 4,206,858 | 6/1980 | DeLuca et al. | 83/660 X |
| 4,209,129 | 6/1980 | Haas et al. | 234/108 |
| 4,425,829 | 1/1984 | Kranik et al. | 83/62.1 |
| 4,799,411 | 1/1989 | Peake | 83/50 |
| 4,821,614 | 4/1989 | Fleet et al. | 83/100 |
| 4,872,381 | 10/1989 | Stroms | 83/76.1 |

OTHER PUBLICATIONS

IBM, TDB, "Multiple Via Punch," vol. 13, No. 9, Feb. 1971, p. 2536.
IBM TDB, "Programmable Cluster Punching System," vol. 16, No. 12, May 1974, p. 3921.
IBM TDB, "Air Spring Programmable Via Punching Head," vol. 16, No. 12, May 1974, pp. 3933-3934.
IBM TDB, "Automated Punch Apparatus for Forming Via Holes in a Ceramic Green Sheet," vol. 20, No. 4, Sep. 1977, pp. 1379-1380.
IBM TDB, "X-Y Positioning System for Punching," vol. 21, No. 11, Apr. 1979, pp. 4473-4475.
IBM TDB, "Automated Punch Apparatus Support Mechanism," vol. 26, No. 7B, Dec. 1983, pp. 3570-3572.
IBM TDB, "Punch Programming Mechanism," vol. 26, No. 10A, Mar. 1984, pp. 5100-5102.
IBM TDB, "Oscillating Punching Mechanism," vol. 30, No. 6, Nov. 1987, pp. 355-358.
IBM TDB, "Magneto Repulsion Punch Drive Circuit," vol. 31, No. 7, Dec. 1988, pp. 423-424.
IBM TDB, "Via Punching Device for Multi-Layered Ceramic Substrates," vol. 32, No. 7, Dec. 1989, pp. 255-257.
IBM TDB, "Flexpunch Machine," vol. 31, No. 9, Feb. 1989, pp. 140-142.

Primary Examiner—Hien H. Phan
Assistant Examiner—Raymond D. Woods
Attorney, Agent, or Firm—Mark E. McBurney

[57] ABSTRACT

A system is provided which utilizes a plurality of sequentially controlled magnetic repulsion punches arranged in a variable array to punch a constantly moving substrate. These punches are disposed adjacent the constant velocity substrate on which holes, or vias are formed as the punches are sequentially fired. The array of punches is placed at an angle with respect to the perpendicular of the direction of movement of the substrate. Thus, a delay is present between the time when the first punch must be fired and the firing of subsequent punches, due to the angle of the array. Therefore, due to this delay between the time the first punch must energized, and the energizing of subsequent punches a single power supply is capable of providing energy to a group of punches. Further, with the system of the present invention, it is possible to punch rows of holes lying in straight rows perpendicular to the direction of movement of the substrate and have different center to center distances on the same substrate, without the necessity of rearranging the array of punches and performing an additional punching operation.

16 Claims, 6 Drawing Sheets

VARIABLE ARRAY PUNCH

BACKGROUND OF THE INVENTION

1. Field of the Invention

The present invention generally relates to the forming of holes in a substrate material, such as is commonly referred to as "greensheet," for the purpose of fabricating electronic circuit components which are ultimately to be used in the manufacture of electronic devices, such as computers, or the like.

2. Description of Related Art

Numerous types of punching devices are found in the prior art. For example, U.S. Pat. No. 4,821,614 describes a punch apparatus with a single punch elements and a programmable apparatus to selectively move a carriage which supports the sheet of material being punched. Another punch apparatus with a single element is described in U.S. Pat. No. 4,872,381. IBM Technical Disclosure Bulletin, Vol. 20, No. 4, Sep. 1977, pps. 1379-1380 discusses a punch apparatus with a plurality of individually activated programmable punching elements. The substrate to be punched is supported by a movable table. IBM TDB, Vol. 26, No. 10A. Mar., 1984, pps. 5100-5102, describes a mechanical punch with a dense array of punches which are electromechanically affixed to a platen which is driven downward at the appropriate time causing a push rod and punch carrier to be driven down. Simultaneously, a punch is driven down, thereby piercing the substrate material IBM TDB, Vol 30, No. 6, Nov., 1989, pps. 355-358 describes a punching apparatus in which a single punch is used to form via holes in the substrate by performing punching with the substrate moving at a constant velocity (on the fly). IBM TDB, Vol. 31, No. 9, Feb., 1989, pps. 140-141, discusses a flexpunch machine which uses a punch and die assembly to produce the entire via hole pattern in the substrate. The punch and die assembly moves at a constant rate while punching the substrate.

Another conventional alternative to a single punch machine is to have an array of equally spaced punches mounted on a bar spanning the width of the substrate being punched and perpendicular to the direction of the movement of the substrate. With this arrangement, the substrate is moved in the direction of the Y-axis, and the punches are fired simultaneously as needed. If the spacing of the punches exceeds the grid size of the holes, and if the ratio of grid size to punch spacing is an integer, then the number of passes of the substrate required to complete the punching task is equal to this ratio. For each pass of the substrate, the material is indexed one grid unit along the X-axis and a discrete indexing device for incremental movement of the substrate along the X-axis is required. Further, due to physical size requirements and electric power usage, the simultaneous firing of the punches on the array requires an independent power supply for each punch. The drawbacks of this system include the power supply problems and the requirement that a discrete indexing device, movable in the X direction be provided.

None of the aforementioned references utilize sequentially controlled, multiple punches in a variable array to perforate a substrate which is being conveyed at a uniform high rate of speed. A major problem exists with punching a constantly moving substrate because the punch speed must be extremely high with respect to the substrate speed in order to avoid any distortion such as ripping, tearing, or the like. Conventional systems which punch "on the fly" must utilize an extremely large power supply in order to obtain the necessary punch speed relative to the substrate speed. Utilization of a large power supply for each punch in an array is impractical since large power supplies have correspondingly large physical size and electric power requirements which limit their use to a single punch, or a die set having plural punches affixed thereto.

Thus, it would be advantageous to have a punching apparatus capable of punching a plurality of holes into a substrate which is moving at a constant velocity. Further, it would be an improvement over conventional systems to have the ability of punching these plural holes on different centers such that electrical components having different spacing of input/output contacts can be affixed to a particular substrate.

SUMMARY OF THE INVENTION

In contrast to the prior art, the present invention utilizes a plurality of sequentially controlled punches arranged in a variably configured array. These punches are disposed adjacent to a continuously moving, constant velocity substrate on which holes, or vias are formed as the punches are sequentially fired.

A major problem with conventional punching systems lies in the simultaneous firing of punches which requires multiple power supplies. A single power supply can be recharged relatively fast and the time required for this recharge and the velocity of the substrate can be taken into account while rotating the angle of the punch array to cause the singular appearance of the hole sites, such that simultaneous firing will become unnecessary. A smaller power supply that can accommodate a single punch and which can be recharged at a high rate of speed is far more advantageous when compared to a much larger and more expensive power supply. Another advantage of the present invention is accommodating multiple grid sizes, which is also achieved by rotating the angle of the punch array. Furthermore, if this angular method is not used (e.g. prior art systems) then punching "on the fly" with multiple punches is not possible.

The array of punches is placed at an angle with respect to the perpendicular of the direction of movement of the substrate. It will be understood by one skilled in this particular art, that with a substrate moving at a constant velocity and an array of punches which are angled with respect to this substrate, sequential firing of the punches is possible. That is, a delay is present between the time when the first punch must be fired and the firing of subsequent punches, due to the angle of the array. Therefore, due to this delay between the time the first punch must be energized and the energizing of subsequent punches a single power supply is capable of providing energy to a group of punches. The recharge speed, between punching operations, of the power supply dictates the maximum velocity of the substrate movement. The time at which the first hole of a column of holes to be punched, perpendicular to the direction of substrate movement, will reach each subsequent punch in the array is delayed by the amount of time required for the substrate to move the linear distance, between the punches in the array. This delay time is a function of the recharge speed of the power supply.

Further, with the magnetic repulsion punching system of the present invention, it is possible to perform punching "on the fly" and form rows of holes having different center to center distances on the same substrate, without the necessity of rearranging the array of punches and performing an additional punching operation.

In accordance with the previous summary, objects features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
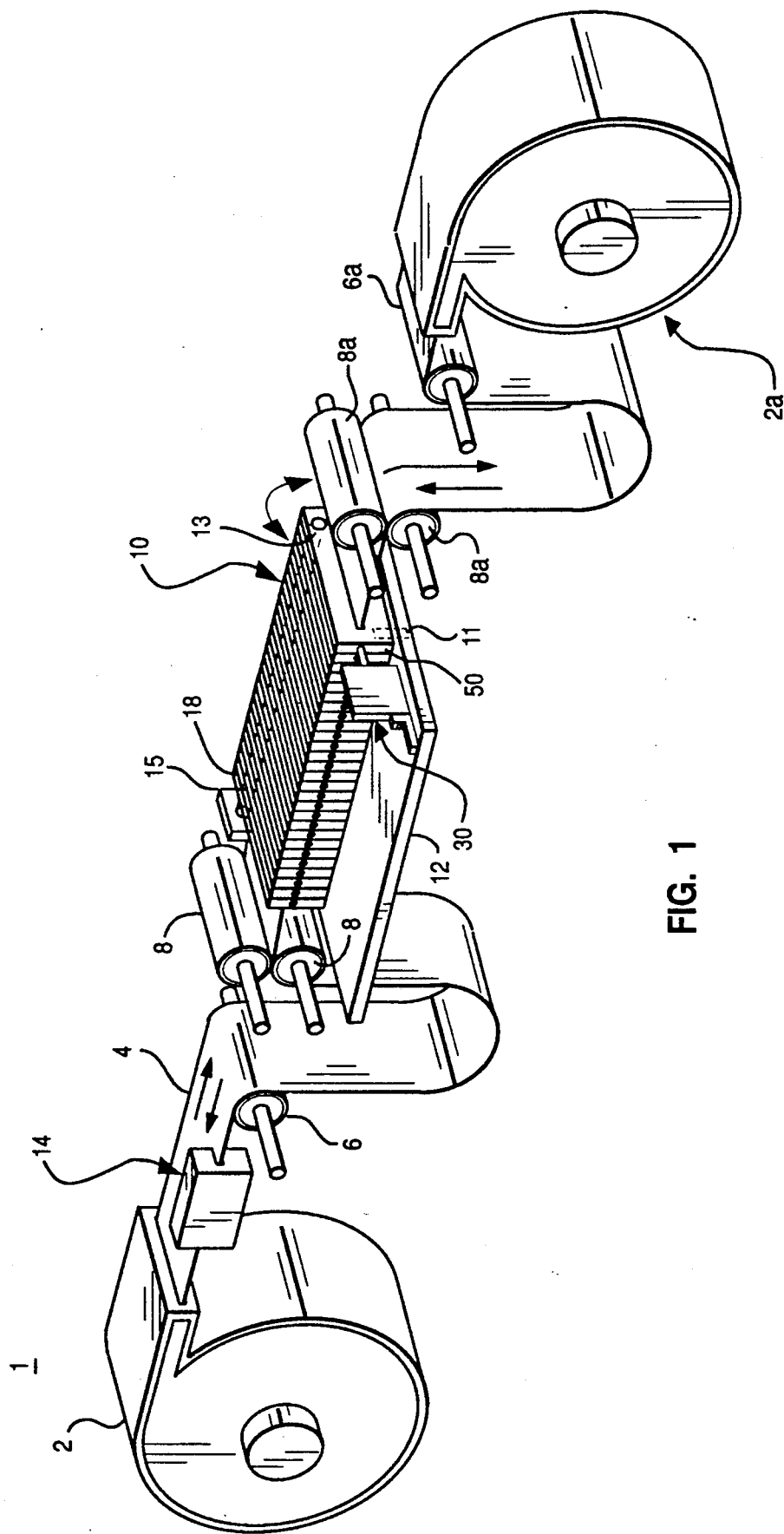
FIG. 1 is a perspective view of the present invention illustrating the relationship of the constant velocity substrate and variable array of magnetic repulsion punches.

One of the most significant features of the high speed punch device of the present invention is that it permits punching "on the fly." Punch on the fly eliminates the need for start and stop actions of the substrate to align the punch with the via site. This feature has significant implications in quality (i.e. accuracy and consistency) of the via holes produced as well as the gain in performance due to non-stop activity.

A logical extension to a single punch device is a multi-punch device, such as the present invention, which is an array of punches that minimizes the amount of movement of the substrate, and increases throughput since the punches operate independently. An independent set of punches requires an independent set of power supplies which can be expensive and electrically demanding (high electrical energy requirements). However, if a single power supply can be recharged fast enough, then this single power supply can be used to accommodate a set of punches provided that the rate at which via sites are encountered (substrate speed) is slower than the power supply recharge rate. It should be noted that a slower substrate handling speed, with multiple punches, is far more technically practical than a high substrate speed and a single punch. This is due to the complexities associated with maintaining a stable hold on a very fine material, i.e. the moving substrate, undergoing punching of very small holes while moving at a high rate of speed. Furthermore, if the material to be punched does not contain a full complement of vias (a low density grid) as is generally the case, then the conventional punching systems will be waiting (with the punches in a ready state) for the via alignment.

With a non-variable array punch and a single power supply having the capacity to fire only a single punch, regardless of the recharge speed punch on the fly will not be possible. In order to achieve punch on the fly, the present invention utilizes the angular perturbation of the punch array so that the vias to be punched will not encounter the punches simultaneously. In this manner, sequential firing can be implemented while punching on the fly. The array punch of the present invention therefore capitalizes on the recharge speed of the power supply for better utilization of the single power supply (thereby avoiding the wait states of conventional systems due to the sparsity of the via holes). while maintaining a lower substrate speed. Again the present invention is a function of the recharge speed of the power supply.

The angular perturbation concept also allows grid flexibility. The mathematics utilized for calculation of this angular displacement are directed toward small angle perturbations, but remain simple and understandable. However, there is not complete freedom in choice of the grids to be punched, due to the fixed distance between adjacent punches in the array. This distance is a critical design parameter which is chosen to accommodate a given set of possible and desirable grid points, i.e. the least common denominator between grid points that is physically possible, is utilized in determining this design parameter.

Referring to FIG. 1, a punch apparatus is shown and generally represented by reference numeral 1. Substrate delivery cassette 2 provides the flexible substrate 4 through guide rollers 6 and tensioning rollers 8, to the array of magnetic repulsion punches 10 spaced along a plurality of cross members 18. Subsequent to punching, the substrate 4 proceeds through additional tensioning rollers 8a, guide rollers 6a and into a receiving substrate cassette 2a. It can be seen how the substrate 4 can be stored on a cassette 2 prior to processing and on cassette 2a after the via holes have been punched. The array of punches 10 is physically mounted on a table 12 parallel to the plane of the substrate. An encoder 14 is disposed adjacent to delivery cassette 2 and determines the position of the substrate 4 with respect to the punch array 10, based upon a plurality of encoded holes 32 (FIG. 4) which run the length of substrate 4. Modular attachment means 50 are movably attached to table 12. It should be noted that many configurations of variable cross members 18 are contemplated by the present invention and FIGS. 1 and 5 merely represent one such possible configuration. A pin 11, about which cross member 18 can rotate, connects attachments means 50 with table 12. Adjustment means, such as a threaded rod 13, are provided which may threadedly engage with each of attachment means 50. Rod 13 is rotatingly affixed anchor means 15, which are attached to table 12. Thus, turning the rod 13 will cause cross members 18 to rotate about pin 11. In this manner, cross members 18 can be angularly displaced with respect to the perpendicular of the direction of movement of substrate 4. Positioning means 30 ensures that cross members 18 do not move in a direction perpendicular to the direction of movement of substrate 4. It should be noted that delivery cassette 2 and receiving cassette 2a illustrate one direction of substrate movement however the punching machine 1 can operate with the substrate moving in either direction. Of course, a single cross member 18 is contemplated by the present invention, however in this case, multiple passes of the substrate 4 beneath punch array 10 will be needed to form the grid of vias. Hence, the machine 1 is a bi-directional device (arrows FIG. 1). In a preferred embodiment a plurality of cross members 18 with their multiple punches 16 and associated power supplies are provided such that punching is accomplished in a single pass of the substrate beneath the array.

Figure 2:
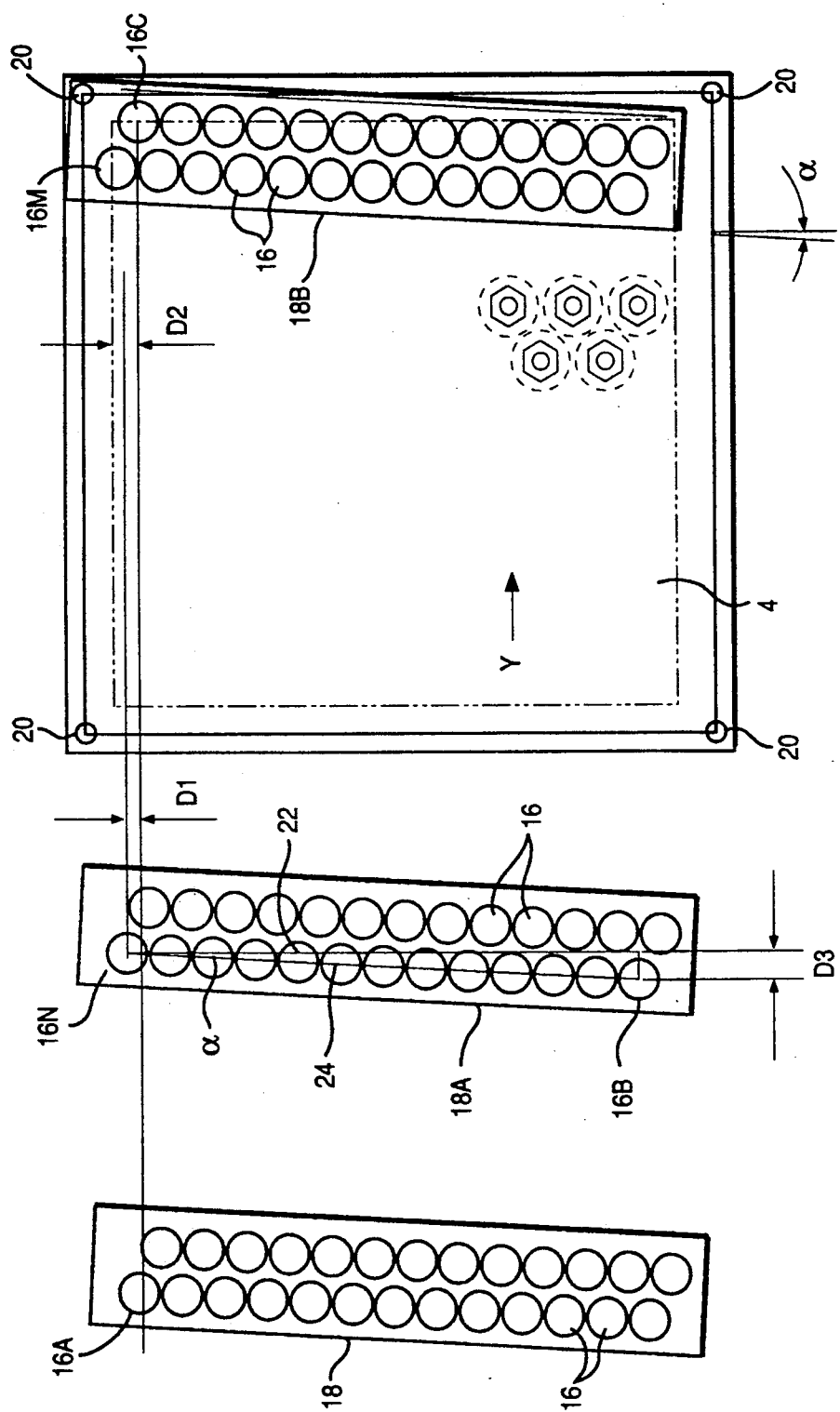
FIG. 2 is a plan view of an array of punches showing the angle of the array with respect to the moving substrate, as well as the ability of the present invention to punch rows of holes having different center to center distances.

FIG. 2 is a plan view showing the placement of individual punches 16 within array 10. It can be seen that array 10 is made up of a plurality of cross members 18 which contain the individual punches 16 therein. Of course a virtually unlimited number of configurations of array 10 are possible by altering the position of cross members 18 and the number and arrangement of the individual punches 16 therein. For example, three cross members 18 are shown in FIG. 2 however additional cross members 18 having punches 16 can be utilized by the punch apparatus of the present invention to achieve single pass grid formation, e.g. such that all cross members 18 are adjacent one another, as noted in FIG. 1.

Corner holes 20 are shown and define the area of substrate 4 which will subsequently be processed by trimming such that the defined area can be stacked with other identically punched areas. The stacked substrates will then have electrically conductive material placed through the aligned punched holes. These stacked substrates will then be furthered processed by a glazing, lamination or the like in order to form an electronic component.

It can also be seen from FIG. 2 that the cross members 18 are offset from the perpendicular to the direction of movement of substrate 4 by an angle alpha ($\alpha$). Due to the offset angle alpha, it can be seen from looking at cross member 18a that the sequential firing of punches 16b through 16n, taking into account an inter-punch delay factor (t) and respective substrate velocity, will result in a row of holes along line 22 which are perpendicular to the movement of substrate 4. This sequential firing of punches 16 allows a much smaller power supply to be used than possible with conventional punching systems. It can be seen that each cross member 18, 18a, 18b . . . 18n will be offset by the angle alpha such that each array of punches can form a row of holes perpendicular to the movement of substrate 4.

The variable nature of array 10 also allows the center to center distance of the punched holes to be variable. It can be seen that distance D1 between punches 16N and 16A will vary as the angle alpha is varied, e.g. the distance will decrease as alpha is increased when cross member 18 is rotated around the first encountered punch 16B. Further, the distance D2 between punches 16A and 16M (FIG. 2) will be varied with respect to increases or decreases in the offset angle alpha ($\alpha$). Therefore, it can be seen how a plurality of holes having different center to center spacing can be punched by the present invention, with a single pass of constantly moving substrate 4.

It can be seen that the line 22, which represents a row of vias to be punched a distance D3 which is the offset distance between the first punch in the row and the last punch in the row (16B and 16N), and line 24 which intersects the center of the row of punches 16B to 16N represents a right triangle. Thus, since the angle can be determined as discussed below, and the length of line 24 is known, the distance D3 can be determined using trigonometric relationships. The inter-punch delay factor is determined by the recharge speed of the power supply used to drive the punches. It is desired that this delay (t) be as small as possible, thereby allowing the substrate speed to be as fast as possible. Basically, the inter-punch delay (t), as set by the power supply, will determine the speed at which the substrate 4 can be moved.

Figure 3:
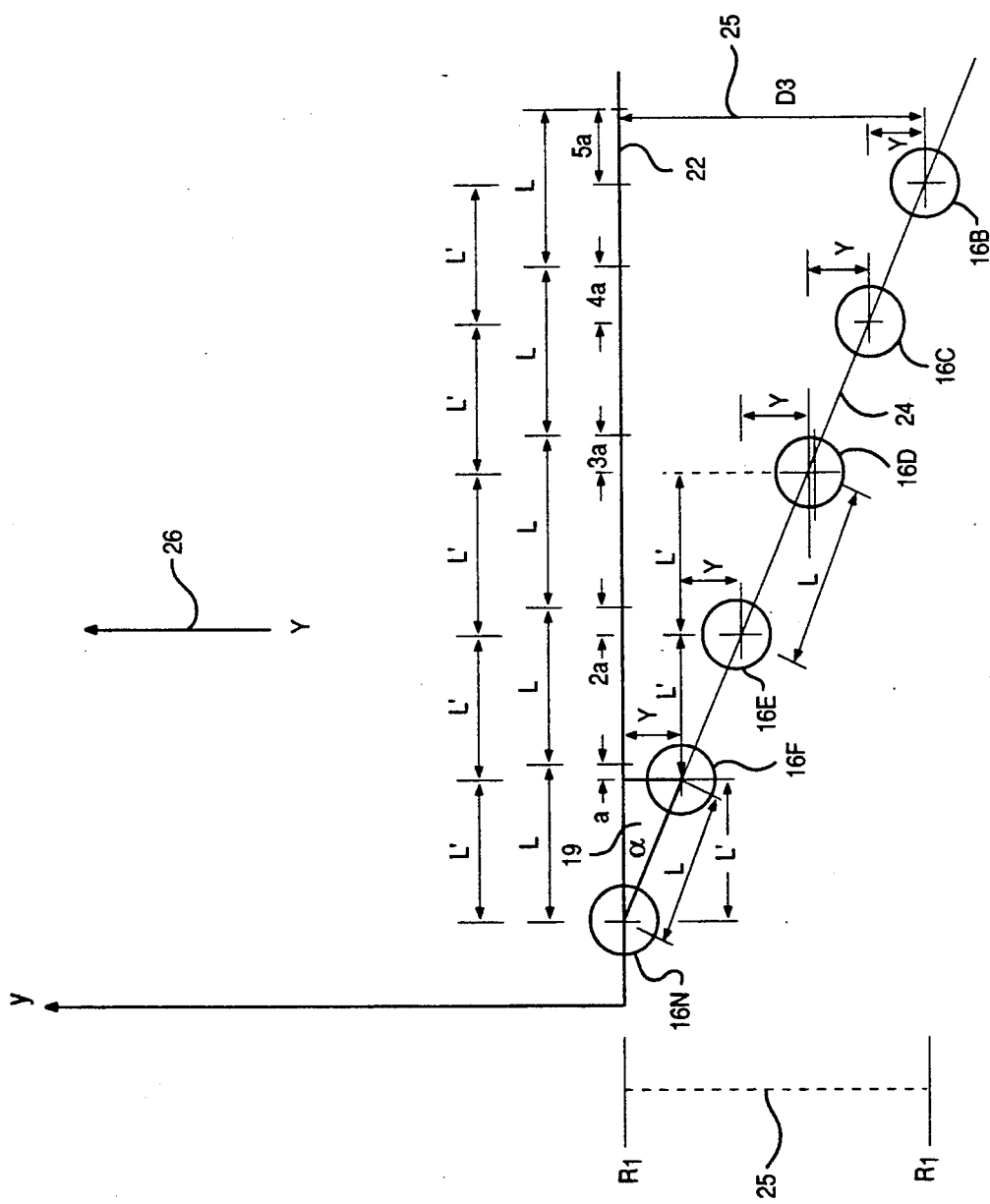
FIG. 3 is a graphical representation of the angular placement of the punches and their relationship to the substrate and one another.

FIG. 3 represents a row of angularly displaced punches 16, the center line 24 which is the hypotenuse of the right triangle. Line 22 is perpendicular to the movement of substrate 4 (FIG. 2) and represents the original position of punches 16 which forms another leg of this triangle. It can be seen that the triangle of FIG. 3 is representative of the triangle previously discussed with regard to FIG. 2 and can be used to illustrate the relationship between the punches of array 10 and substrate 4, when the configuration of array 10 is varied. FIG. 3 represents a row of punches 16 such as are disposed on cross member 18a and form the hypotenuse (line 24) of the triangle. The distance between the first and last punch along cross arm 18a is again represented by distance D3.

As stated above, simultaneous firing of a plurality of punches on an array requires an independent power supply for each punch since the amount of electrical energy required is such that one power supply cannot practically supply the energy requirements for plural punches when fired simultaneously. Therefore the present invention contemplates a plurality of punches that are configured as an array and can be fired sequentially each sequence of punches using only a single power supply. It should be noted that the total array of punches 10 may consist of numerous pluralities of punches which are associated with a single power supply A computer, such as a programmable controller 80 (FIG. 8) will coordinate the sequential firing of the punches within array 10. In a preferred embodiment, approximately 10 to 20 punches will be associated with a single power supply.

In order to permit sequential firing of punches into a constantly moving substrate, the array is placed at a small angle alpha from the perpendicular with respect to the movement of the substrate. Thus, an offset is created to accommodate the inter-punch delay (t) while the substrate is under constant movement. The angle alpha ($\alpha$) can be described as follows:

$$\alpha = \arctan \frac{d}{(n-1)L}$$

where d is equal to the size of the grid to be punched; n is equal to the number of punches (which are spaced equidistant from one another along cross member 18 and controlled by a single power supply); and L is equal to the spacing between the punches along the cross member 18.

From FIG. 3 it can be seen that the substrate 4 is moving in a direction as shown by arrow 26. The velocity of the substrate is denoted as V and the velocity is required to be less than or equal to the size of the grid, divided by the number of punches plus one multiplied by the inter-punch delay factor, i.e. V is less than or equal to $d/(n-1)t$. It can be seen from FIG. 3 that punch 16b will be fired first as the point on substrate 4 where a row R1 of holes is to be formed approaches the array, i.e. punch 16B will be the first one fired. Subsequently, each punch contained along cross member 18a will be sequentially fired in the order from right to left as shown in FIG. 3. The sequential firing takes into account the inter-punch delay (t) which represents the time required for a point e.g. a hole being punched on row R1 to travel between each punch 16 in the Y direction, taking into account the recharge time of the power supply, as shown in FIG. 3. Once the last point on row R1 is punched by punch 16N, the row R1 is complete and the holes are formed within substrate 4. Line 25 is equivalent to distance D3 and represents the total inter-punch delay time, from the initial firing of punch 16B to the firing of punch 16N, elapsed during the punching of the entire row R1. With the velocity less than or equal to the ratio of grid size over the number of punches plus one multiplied the inter-punch delay, ($V \leq d/(n-1)t$, all holes on a row within a matrix of holes to be punched on the substrate will be formed prior to the next row being formed.

However, to make the design of the punch array flexible such that a range of grid sizes d can be accommodated, it is required that the distance L between punches 16 be set to the least common denominator of the set of grid sizes to be formed. This least common denominator, di, is subject to the minimum physical spacing requirements of the punches 16. It can be appreciated by one skilled in the art, that in many cases the minimum physical spacing requirements of the punches will be so large that many problems arise and inefficiencies occur.

To compensate for these inefficiencies, the present invention allows the array to be rotated through the angle alpha which can be determined to provide for any desired grid size d. First, the spacing between punches L must be set to the maximum value of the least common denominator di of the set of grid sizes d. For example, if grid sizes of 10, 20 and 30 thousandths of an inch (mil) are present, then the least common denominator of grid sizes di equals 60 mils. Next, the smallest feasible L is chosen such that L divided by d is an integer. In the previous example 60 mils is the smallest feasible grid size which would yield an integer when divided by the grid size d, e.g. 60/10=6; 60/20=3; and 60/30=2. It can be seen that the punch spacing L will be set based upon the physical characteristics of the punches 16. With the punches utilized by the present invention, 60 mil spacing is not possible, however a spacing of approximately 600 mils can be used. The present invention contemplates punching of any other grid size d' where d' is less than or equal to the maximum d value, as described above. For the other grid sizes d' the cross member 18 of variable array 10 will be rotated at the location of the first punch, e.g. 16B. FIGS. 2 and 3, through the angle alpha ($\alpha$) where the projection, of the distance between the punches L, through the angle alpha on to the axis perpendicular (the projection of the distance L on to the perpendicular axis is noted as L') to the movement of the substrate will satisfy the equation: $L' = L\cos\alpha$, for the cases where L' divided by d' is an integer. It will be understood that the majority of applications of the present invention will utilize grid sizes other than d maximum. Therefore the calculation of alpha ($\alpha$) must be made for the majority of grid spacing of holes to be punched on a substrate 4.

To calculate a set up value for the angle alpha ($\alpha$), required to yield the desired grid size d', the trigonometric relationships of the triangle shown in FIGS. 2 and 3 will be used. The angle alpha will be changed for each different grid size being punched if the number of cross members 18 is such that multiple passes of the substrate 4 are required. It can be seen from FIG. 3 that a right triangle is formed by lines 22,24 and D3 which encompasses the total number of punches along cross member 18a, i.e. 16B-16N. In this case, L' will equal to (L−a) where "a" is equal to the difference in distance between the punches 16 along cross member 18, i.e. L, and the distance between punches 16 (i.e. L') in the direction perpendicular to substrate 4 after they have been projected through the angle alpha. It should be noted that the value of L' corresponds to the component of distance between punches, projected on to the X axis of a cartesian coordinate system. Additionally, a right triangle 19 can be formed where the hypotenuse is equal to L and L' is the adjacent leg and equal to L−a. The distance "a" can be calculated by finding the largest integer m for which the quantity [L−(md')] is positive, where d' is the new grid size to be punched based upon the rotation of the angle alpha ($\alpha$). In this manner, the present invention uses the smallest possible angle alpha, such that the resulting projection of L' contains an integer multiple of the grid unit size d'.

It can be seen that the number of punches n will always be an integer and since the value for L' which is equal to L−a is a projection of the distance L through an angle alpha on to the X axis, the projection of L in the Y direction (the direction of movement of the substrate 4) can be determined using the Pythagorean theorem as follows:

$$Y^2 + (L')^2 = L^2$$

substituting L−a for L' we have:

$$Y^2 = L^2 - (L-a)^2, \text{ and}$$

$$Y = sqrt[L^2 - (L-a)^2]$$

therefore,
alpha = arcsin(Y/L)

It can be seen from FIG. 3 that the calculated Y value is equal to the distance, along the direction of movement of the substrate 4, between adjacent punches 16. For equally spaced punches on cross member 18, the total Y distance will be equal to the Y value multiplied by the number of punches n minus 1, i.e. $Y_{tot} = Y(n-1)$. For the example of FIG. 3, six punches are shown (n=6), therefore $Y_{tot} = Y(6-1) = 5Y$.

As noted above, the present invention provides for sequential firing of punches 16. In order to accomplish this goal, the inter-punch delay time (t) must be considered. The velocity V is known and the distance Y between adjacent punches can be calculated as described above. Therefore, the inter-punch delay time (t) is equal to the distance Y divided by the velocity V, t=Y/V. As noted above, the inter-punch delay (t) will be a function of the recharge time required by the power supply. Thus for a given angle alpha ($\alpha$), since Y is dependent upon alpha, velocity V is varied in order to optimize the punching speed of the system of the present invention. The velocity V of substrate can be varied by conventional means such as a variable speed electric motor coupled to the cassettes 2, 2a or tensioning rollers 8,8a (see FIG. 1). Further, the quantity L multiplied by Y and divided by d' for all values where n is equal to one, through n−1, must not be an integer since this will indicate that multiple holes will be lined up to be punched simultaneously. As previously noted, a feature of the present invention allows utilization of a single electrical power supply for a plurality of sequentially fired punches, by ensuring that multiple holes to be punched are not aligned for simultaneous punching, in contrast to the prior art.

It will be understood how the inter-punch delay (t), and the projected angle alpha can be considered such that a grid of holes having different center to center distances can be punched. The calculation of the angle alpha ($\alpha$) and time (t) take into account the punch spacing L along cross member 18 and the X and Y components of the punch array 10 based upon the angle alpha, as well as the recharge speed of the power supply and the velocity of the substrate. As shown in FIG. 1, adjustment means may include a threaded rod 13, or another conventional arrangement, which can be used to rotate the array 10 about a point (pin 11) on each cross member by the calculated angle alpha, which has been determined as discussed above. It should be noted that large volume punching applications are possible where identical grids of vias are to be formed on many substrates and the angle alpha is built into the punch apparatus. That is, cross members 18 of array 10 are constructed so as to be affixed at a permanent angle alpha (FIG. 5).

Figure 4:
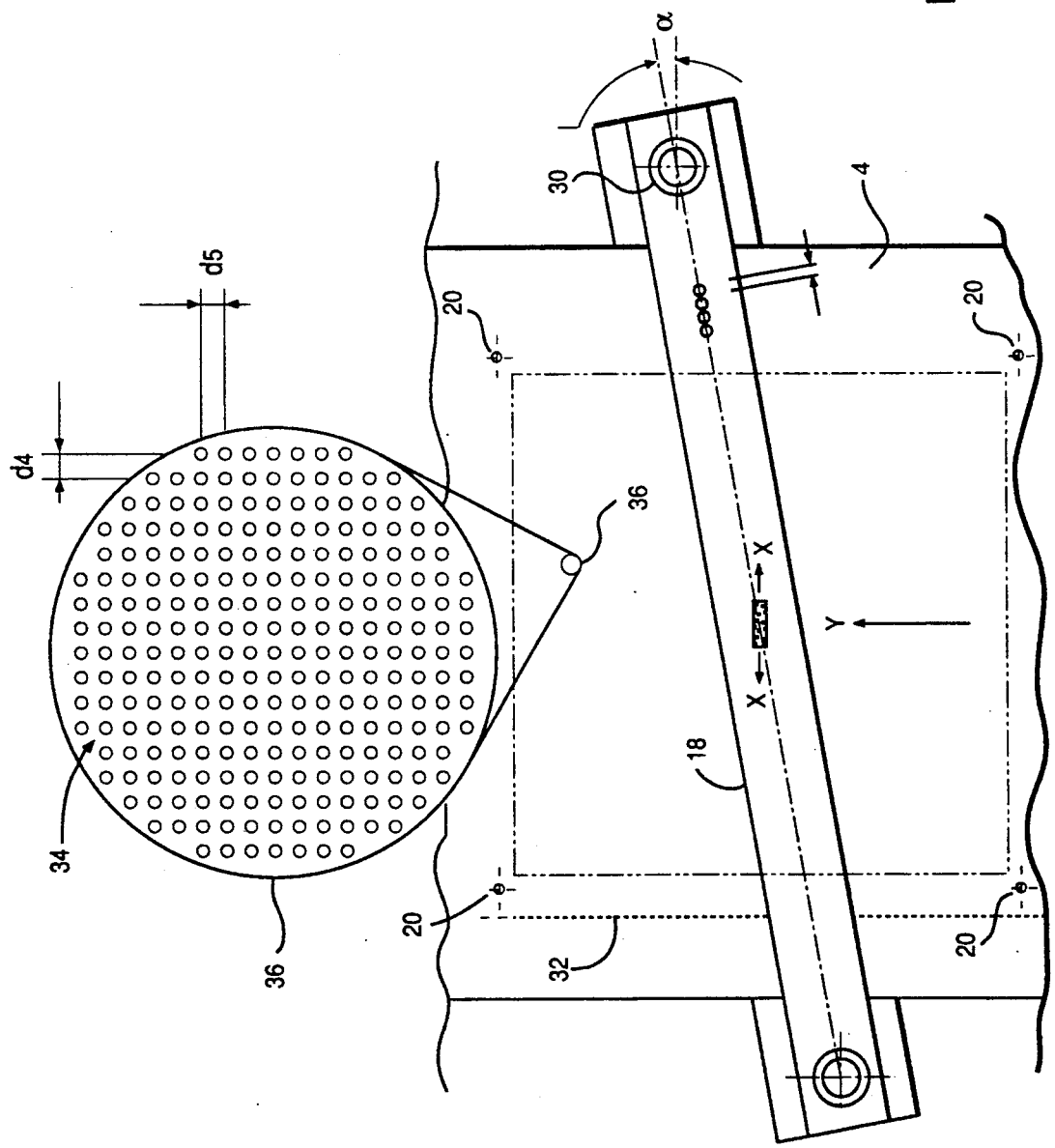
FIG. 4 is another plan view of an array of punches showing the angular relationship between the array and the substrate.

FIG. 4 is another plan view of the punching apparatus of the present invention including encoder holes 32, which are read by encoder 14, and are shown disposed along the length of one side of continuous substrate 4. The information obtained by encoder 14 is then supplied to a programmable controller 80, shown in FIG. 8. Cross member 18 is shown and oriented at the angle ($\alpha$). It can be seen that the present invention contemplates both a positive and negative slope of cross member 18 with respect to the X and Y coordinates. Finally, a representative area 36 of a grid to be punched within substrate 4 is shown wherein holes, or vias 34 have been punched into substrate 4. Grid spacings D4 and D5 are shown and represent the spacing L' and Y of FIG. 3, respectively.

Figure 5:
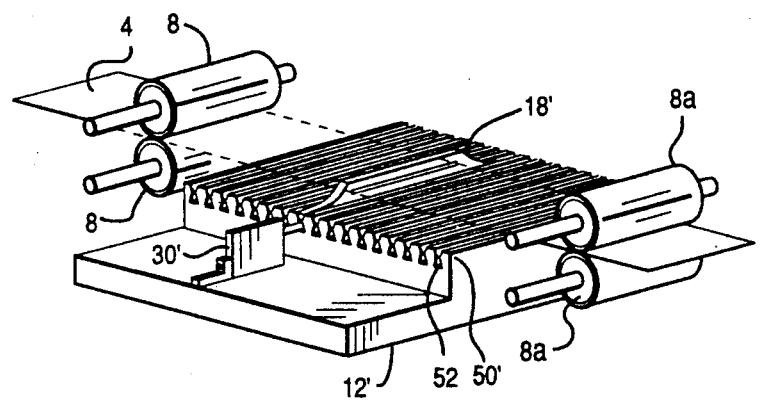
FIG. 5 is a perspective view of the substrate and means for maintaining the variable punch array in a fixed position and illustrates the modular nature of the array.

FIG. 5 is a more detailed view of another embodiment of the punching apparatus of the present invention. As is noted on FIG. 1, substrate 4 moves between tensioning rollers 8, 8a and adjacent and underneath cross member 18'. Underneath cross member 18' are the attachment means 50' which releasably engage cross member 18' (see FIG. 6) such that the triangularly shaped base member 51 of cross member 18' can be inserted and slid into triangular shaped aperture 52 of the attachment means 50', thereby affixing cross member 18' to table 12'.

Figure 6:
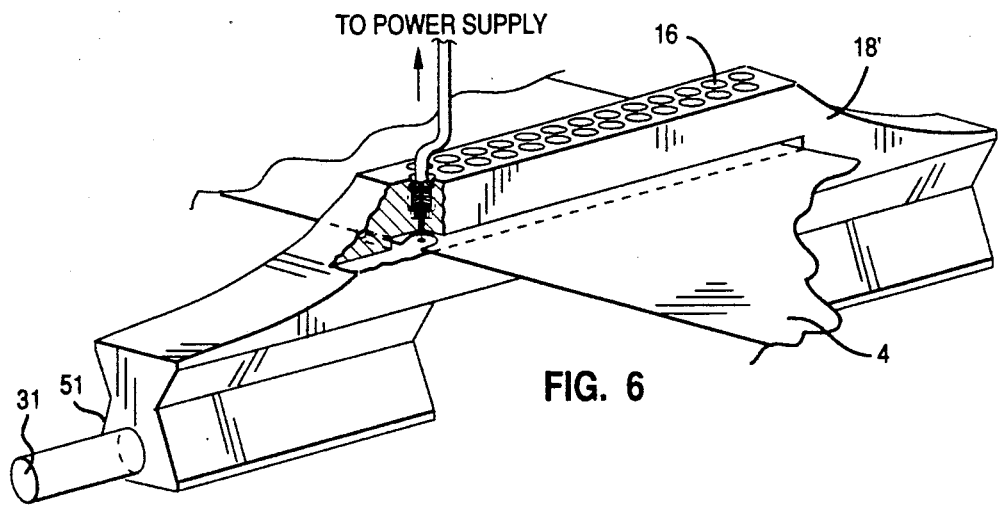
FIG. 6 is a perspective view of the modular cross member of the array along with the substrate being punched.

FIG. 6 is a perspective view of cross member 18' showing the base portion 51 and a connector 31 which attaches to positioning means 30' (FIG. 5) to maintain the cross member 18' in the desired position and prevents any slidable movement thereof in the X direction during the punching operation.

Figure 7:
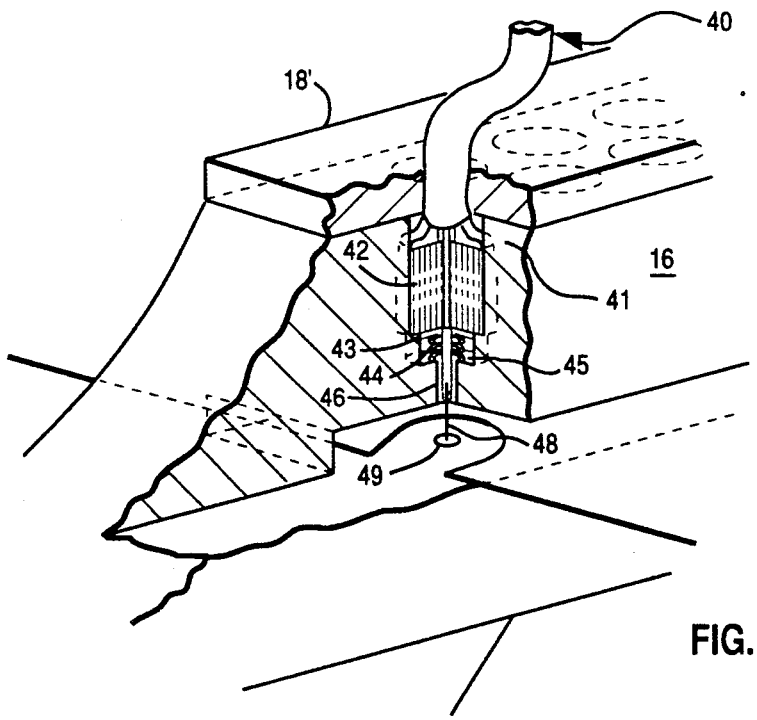
FIG. 7 is a detailed view of a magnetic repulsion punch and its relationship to the present invention.
Figure 8:
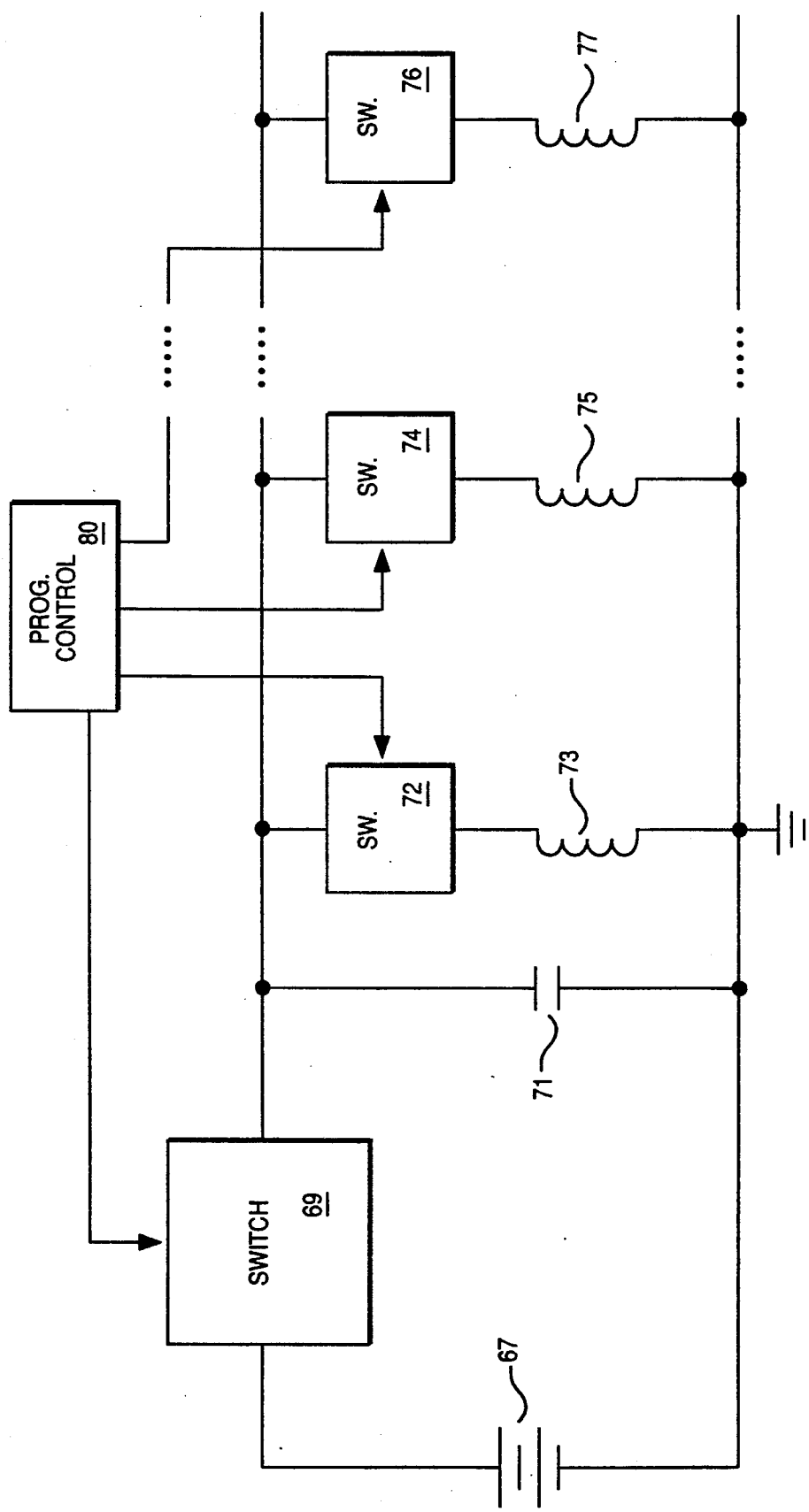
FIG. 8 is a schematic diagram of a power supply which may be utilized by the present invention.

FIG. 7 is a detailed view of the actual punch 16 of the present invention. A cable 40 connects an electro-magnetic coil 42 with a power supply (FIG. 8). A coolant chamber 41 is disposed adjacent to coil 42 and allows for the circulation of fluid in order to dissipate heat from coil 42, thereby increasing its capacity. An electrically conductive disk 43 is disposed adjacent to coil 42 and affixed to punch 48 and is repulsed away from coil 42 when the power supply provides current thereto. Spring 44 is annularly displaced around punch 48 and disposed within chamber 45 for biasing the disk 43 adjacent coil 42. Guide bushing 46 is disposed annularly around punch 48 and provides for downward guidance thereof. A die 49 is shown which provides support for substrate 4 during the punching operation such that stretching or tearing of the green sheet is minimized.

FIG. 8 refers to a representative power supply which may be used by the present invention to implement the sequential firing of punches 16 of array 10. A voltage source 67 and charging switch 69 are provided by this representative power supply. A capacitor 71 supplies the electrical energy to inductors 73, 75, 77. It should be noted that inductors 73, 75, 77 each represent the electro-magnetic coils 42 of a punch 16. A programmable controller 80, which may be any of a number of commercially available models, is used to control switch 69 in order to allow charging of capacitor 71. Additionally, controller 80 controls switches 72, 74, 76. Each of the switches 69, 72, 74, 76 may be a silicon controlled rectifier (SCR) which is controllable by electrical pulses from the controller 80. The closing of switches 72, 74, 76 in a sequentially timed fashion allows the electrical energy discharged by capacitor 71 to be provided to one of the inductors 73, 75, 77 (coils 42) of punch 16. In order to achieve this sequential firing, the programmable controller 80 is set, or programmed to close the switches based on the previously determined angle alpha; the inter-punch delay time (t), which is a function of the capacitor recharge speed; and the variable speed of substrate 4. Generally, power supplies represent a limitation in the magnetic repulsion punching technology due to the time required to charge and discharge the capacitor 71. It should be noted that the present invention partially removes this limitation by sequentially firing punches 16, which allows smaller power supplies to be used with less electrical energy requirements and correspondingly faster charge and discharge times. Therefore, in a preferred embodiment, the present invention sequentially energizes the inductors 73, 75, 77 as fast as possible given the limitations of capacitor 71, while varying the substrate speed, based upon the previously calculated values of alpha ($\alpha$) and the known inter-punch delay time (t). Finally, it should be noted that switch 76 and inductor 77 of FIG. 8 schematically represent the plurality of punches (switches and inductors) which may be associated with a single power supply and sequentially fired, as contemplated by the present invention.

Based upon the previous description taken in conjunction with the drawings, it can be seen how the present invention provides a variably arranged array of punches such that a grid having holes with different center to center distances can be punched. Further, the sequential firing of punches allows a virtually unlimited number of punches to be utilized per substrate since a single power supply can be used to energize multiple punches.

Although certain preferred embodiments have been shown and described, it should be understood that many changes and modifications may be made therein without departing from the scope of the appended claims. For example, a fiber optical system can be utilized in conjunction with the present invention for inspecting and verifying the completion of a punch operation.

What is claimed is:

1. A method of punching a constantly moving substrate, comprising:
   disposing a plurality of punches adjacent said substrate;
   angularly displacing said punches with respect to the direction of movement of said substrate;
   sequentially actuating said punches to form a grid of holes in said substrate; and
   varying the speed of said substrate for a particular grid of holes to be punched.

2. A method according to claim 1 wherein said step of disposing comprises the step of linearly arranging said punches across said substrate.

3. A method according to claim 2 wherein said step of angularly displacing comprises the steps of:
   calculating the amount of said angular displacement of said punches; and
   displacing said punches by the calculated angular displacement.

4. A method according to claim 3 wherein said calculated angular displacement is a function of the grid size, number of punches linearly arranged across said substrate and the distance between said punches.

5. A method according to claim 4 wherein said step of sequentially actuating said punches comprises the steps of:
   providing a cyclically recharging electric power supply for actuating said punches; and
   controlling the actuation of said punches to correspond with the cyclic recharging rate of said power supply.

6. A method according to claim 5 wherein said step of controlling comprises the step of delaying the energization of said punches for a predetermined period of time to ensure that said power supply is recharged.

7. A method according to claim 6 wherein said step of sequentially actuating said punches comprises the step of forming a grid of holes having a plurality of holes therein with different spacings between said holes.

8. A method according to claim 7 wherein said step of varying the speed comprises the step of varying the substrate speed based upon the grid size, number of said punches utilized and the predetermined period of time for power supply recharging.

9. An apparatus for punching a constantly moving substrate, comprising:
   means for disposing a plurality of punches adjacent said substrate;
   means for angularly displacing said punches with respect to the direction of movement of said substrate;
   means for sequentially actuating said punches to form a grid of holes within said substrate; and
   means for varying the speed of said substrate for a particular grid of holes to be punched.

10. An apparatus according to claim 9 wherein said means for disposing comprises means for linearly arranging said punches across said substrate.

11. An apparatus method according to claim 10 wherein said means for angularly displacing comprises:
    means for calculating the amount of said angular displacement of said punches; and
    means for displacing said punches by the calculated angular displacement.

12. An apparatus according to claim 11 wherein said calculated angular displacement is a function of the grid size, number of punches linearly arranged across said substrate and the distance between said punches.

13. An apparatus according to claim 12 wherein said means for sequentially actuating said punches comprises:
    a cyclically recharging electric power supply for actuating said punches: and
    means for controlling the actuation of said punches to correspond with the cyclic recharging rate of said power supply.

14. An apparatus according to claim 13 wherein said means for controlling comprises means for delaying the energization of said punches for a predetermined period of time to ensure that said power supply is recharged.

15. An apparatus according to claim 14 wherein said means for sequentially actuating comprises means for forming a grid of holes having a plurality of holes therein with different spacings between said holes.

16. An apparatus according to claim 15 wherein said means for varying the speed comprises means for varying the substrate speed based upon the grid size, number of said punches utilized and the predetermined period of time for power supply recharging.

* * * * *

UNITED STATES PATENT AND TRADEMARK OFFICE
CERTIFICATE OF CORRECTION

PATENT NO. : 5,140,879

DATED : August 25, 1992

INVENTOR(S) : Javad Jah-Ali-Ahmadi, Jerome A. Frankeny and Karl Hermann

It is certified that error appears in the above-identified patent and that said Letters Patent is hereby corrected as shown below:

Col. 1, line 15, please delete "a single";

Col. 4, line 8, after "speed", please insert --,--;

line 60, after "fixed", please insert --to--;

Col. 5, line 32, please delete "furthered" and insert --further--;

line 64, after "punched", please insert --,--; and

Col. 9, line 47, please delete "the".

Signed and Sealed this

Twenty-eighth Day of September, 1993

Attest:

BRUCE LEHMAN

*Attesting Officer*     *Commissioner of Patents and Trademarks*